(12) United States Patent
Tauchi et al.

(10) Patent No.: US 9,011,065 B2
(45) Date of Patent: Apr. 21, 2015

(54) VACUUM PROCESSING APPARATUS AND OPERATING METHOD OF VACUUM PROCESSING APPARATUS

(75) Inventors: Susumu Tauchi, Shunan (JP); Hideaki Kondo, Kudamatsu (JP); Teruo Nakata, Yokohama (JP); Keita Nogi, Tokyo (JP); Atsushi Shimoda, Hiratsuka (JP); Takafumi Chida, Chigasaki (JP)

(73) Assignee: Hitachi High-Technologies Corporation, Tokyo (JP)

( * ) Notice: Subject to any disclaimer, the term of this patent is extended or adjusted under 35 U.S.C. 154(b) by 594 days.

(21) Appl. No.: 12/871,333

(22) Filed: Aug. 30, 2010

(65) Prior Publication Data

US 2011/0110751 A1 May 12, 2011

(30) Foreign Application Priority Data

Nov. 12, 2009 (JP) ................................. 2009-258491

(51) Int. Cl.
*H01L 21/677* (2006.01)
*H01L 21/67* (2006.01)

(52) U.S. Cl.
CPC .... *H01L 21/67745* (2013.01); *H01L 21/67184* (2013.01); *H01L 21/67196* (2013.01); *Y10S 414/139* (2013.01)

(58) Field of Classification Search
USPC ................................. 414/217, 217.1, 935, 939
See application file for complete search history.

(56) References Cited

U.S. PATENT DOCUMENTS

| | | | | |
|---|---|---|---|---|
| 5,310,410 A | * | 5/1994 | Begin et al. ................... | 29/25.01 |
| 5,380,682 A | * | 1/1995 | Edwards et al. .............. | 438/800 |
| 5,695,564 A | * | 12/1997 | Imahashi ....................... | 118/719 |
| 5,730,801 A | * | 3/1998 | Tepman et al. ................ | 118/719 |
| 5,897,710 A | * | 4/1999 | Sato et al. ......................... | 427/8 |
| 6,707,544 B1 | * | 3/2004 | Hunter et al. .............. | 356/237.5 |
| 7,014,887 B1 | * | 3/2006 | Cohen et al. ................... | 427/534 |
| 7,128,305 B2 | * | 10/2006 | Tomasch ........................ | 251/211 |
| 7,431,795 B2 | * | 10/2008 | Kumar et al. ............. | 156/345.32 |
| 7,432,201 B2 | * | 10/2008 | Takehara et al. .............. | 438/685 |
| 7,458,763 B2 | * | 12/2008 | van der Meulen ............ | 414/217 |
| 7,945,348 B2 | * | 5/2011 | Pannese et al. ................ | 700/248 |
| 8,146,530 B2 | * | 4/2012 | Ishikawa et al. .............. | 118/503 |
| 8,181,596 B2 | * | 5/2012 | Ishikawa et al. .............. | 118/500 |

(Continued)

FOREIGN PATENT DOCUMENTS

| | | |
|---|---|---|
| JP | 2007-511104 | 4/2007 |
| WO | WO 2005/048313 A2 | 5/2005 |
| WO | WO 2005/048313 A3 | 5/2005 |

*Primary Examiner* — Saul Rodriguez
*Assistant Examiner* — Glenn Myers
(74) *Attorney, Agent, or Firm* — Baker Botts L.L.P.

(57) ABSTRACT

A vacuum processing apparatus which includes an atmospheric transfer chamber having a plurality of cassette stands for transferring a wafer, a lock chamber for storing the wafer, a first vacuum transfer chamber to which the wafer from the lock chamber is transferred, a transfer intermediate chamber connected to the first vacuum transfer chamber, and a second vacuum transfer chamber connected to the transfer intermediate chamber. At least one vacuum processing chamber is connected to the first vacuum transfer chamber, and two or more vacuum processing chambers are connected to a rear side of the second vacuum transfer chamber. A plurality of gate valves are disposed between the first vacuum transfer chamber and each of the lock chamber, the transfer intermediate chamber, and the vacuum processing chamber coupled to the first vacuum transfer chamber. A control unit is also provided for controlling operation of the gate valves.

7 Claims, 3 Drawing Sheets

(56) References Cited

U.S. PATENT DOCUMENTS

| | | |
|---|---|---|
| 8,309,374 B2 * | 11/2012 | Porthouse et al. ............... 438/19 |
| 2003/0131458 A1 * | 7/2003 | Wang et al. .................. 29/25.01 |
| 2004/0005211 A1 * | 1/2004 | Lowrance et al. ......... 414/744.1 |
| 2006/0021575 A1 * | 2/2006 | Ishizawa et al. .............. 118/719 |
| 2008/0025821 A1 * | 1/2008 | White et al. ................... 414/217 |
| 2008/0232947 A1 * | 9/2008 | van der Meulen et al. ... 414/805 |
| 2008/0232948 A1 | 9/2008 | van der Meulen et al. |
| 2008/0274288 A1 * | 11/2008 | Kondo et al. ................. 427/294 |
| 2009/0087286 A1 * | 4/2009 | Meulen ......................... 414/217 |
| 2009/0259335 A1 * | 10/2009 | Ikeda et al. ................... 700/228 |

* cited by examiner

VACUUM PROCESSING APPARATUS AND OPERATING METHOD OF VACUUM PROCESSING APPARATUS

The present application is based on and claims priority of Japanese patent application No. 2009-258491 filed on Nov. 12, 2009, the entire contents of which are hereby incorporated by reference.

BACKGROUND OF THE INVENTION

1. Field of the Invention

The present invention relates to the arrangement of a vacuum processing system having a transfer mechanism of a semiconductor processing substrate (including semiconductor wafers and other substrate-shaped samples, hereinafter simply referred to as a "wafer") disposed between a vacuum processing chamber and a vacuum transfer chamber of a semiconductor processing apparatus, and a vacuum processing method using this system. Especially, the present invention relates to the arrangement of a vacuum processing system having a plurality of vacuum processing chambers connected in series via a transfer mechanism disposed within a plurality of vacuum transfer chambers, and a vacuum processing method using the same.

2. Description of the Related Art

In the art related to the above-described type of apparatuses, especially apparatuses for processing objects within a decompressed chamber, there are demands for enhancing the microfabrication and precision of the process, and for enhancing the processing efficiency of the substrate to be processed. In response to such demands, there has been developed a multiple chamber apparatus in which a plurality of vacuum processing chambers are disposed in a single apparatus, according to which the production efficiency per footprint within a clean room has been improved.

According to such apparatus equipped with a plurality of vacuum processing chambers and other chambers used for processing, the gas and the pressure in the interior of each vacuum processing chamber or other chambers are controlled in a decompressable manner, and the chambers are connected to a vacuum transfer chamber having a robot arm or the like for transferring the substrates being processed.

According to such arrangement, the size of the whole body of the vacuum processing chamber is determined by the size, the number and the arrangement of the vacuum transfer chambers and the vacuum processing chambers. The arrangement of the vacuum transfer chambers is determined by the vacuum transfer chamber disposed adjacent thereto or the number of vacuum processing chambers connected thereto, the turning radius of the transfer robot disposed therein, the wafer size, and so on. Further, the arrangement of the vacuum processing chambers is determined by the wafer size, the vacuum efficiency, or the arrangement of devices required for wafer processing. Further, the arrangements of the vacuum transfer chambers and the vacuum processing chambers are also determined by the number of processing chambers required for the process or the maintenance performances thereof.

Regarding the above demands, patent document 1 (International publication of International Application published under the patent cooperation treaty No. 2007-511104) discloses methods and systems for handling workpieces in a vacuum-based semiconductor handling system, including methods and systems for handling materials from arm to arm in order to traverse a linear handling system. The disclosure of patent document 1 aims at solving the problems of a linear tool while answering to the demands for realizing a semiconductor processing apparatus capable of overcoming the restrictions specific to a cluster tool, to thereby provide a vacuum processing system capable of having wafers transferred therein with a small footprint.

SUMMARY OF THE INVENTION

The above-mentioned prior art aims at providing a method and system for transferring wafers, but the following problems were not sufficiently considered.

The prior art lacked to consider the number and relationship of arrangement of the units constituting the vacuum processing system, which are vacuum transfer chambers for transferring wafers in vacuum and the vacuum processing chambers for processing wafers as the objects to be processed, so that the production efficiency thereof is optimized. As a result, the productivity per footprint of the apparatus was not optimized.

According to the prior art in which the productivity per footprint is not sufficiently considered, the wafer processing ability per footprint of the apparatus constituting the vacuum processing system had been deteriorated.

Therefore, the object of the present invention is to provide a vacuum processing system and a vacuum processing method for semiconductor substrates in which a high productivity per footprint is realized.

In order to solve the above-mentioned problems of the prior art, the present invention provides a vacuum processing system of a semiconductor processing substrate comprising an atmospheric transfer chamber having a plurality of cassette stands arranged on a front side thereof for transferring a wafer stored in a cassette disposed on one of the plurality of cassette stands, a lock chamber arranged on a rear side of the atmospheric transfer chamber for storing in an interior thereof the wafer transferred from the atmospheric transfer chamber, a first vacuum transfer chamber connected to a rear side of the lock chamber to which the wafer from the lock chamber is transferred, a transfer intermediate chamber connected to a rear side of the first vacuum transfer chamber, a second vacuum transfer chamber connected to a rear side of the transfer intermediate chamber to which the wafer from the transfer intermediate chamber is transferred, at least one vacuum processing chamber connected to a rear side of the first vacuum transfer chamber for processing the wafer transferred thereto from the first vacuum transfer chamber, and two or more vacuum processing chambers connected to a rear side of the second vacuum transfer chamber for processing the wafer transferred thereto from the second vacuum transfer chamber, wherein the number of vacuum processing chambers connected to the first vacuum transfer chamber is smaller than the number of vacuum processing chambers connected to the second vacuum transfer chamber.

Further, the vacuum processing system of a semiconductor processing substrate comprises a first vacuum processing chamber connected to the first vacuum transfer chamber for processing the wafer transferred thereto from the first vacuum transfer chamber and a second and third vacuum processing chambers connected to the second vacuum transfer chamber for processing the wafer transferred thereto from the second vacuum transfer chamber are provided, wherein the number of vacuum processing chambers connected to the first vacuum transfer chamber is one, and the number of vacuum processing chambers connected to the second vacuum transfer chamber is two.

According even further to the vacuum processing system of a semiconductor processing substrate, a transfer robot is disposed respectively in the first and second vacuum transfer chambers, and each transfer robot comprises a plurality of arms.

Moreover, the present invention provides a vacuum processing method for processing a semiconductor processing substrate using a vacuum processing system of a semiconductor processing substrate comprising an atmospheric transfer chamber having a plurality of cassette stands arranged on a front side thereof for transferring a wafer stored in a cassette disposed on one of the plurality of cassette stands, a lock chamber arranged on a rear side of the atmospheric transfer chamber for storing in an interior thereof the wafer transferred from the atmospheric transfer chamber, a first vacuum transfer chamber connected to a rear side of the lock chamber to which the wafer from the lock chamber is transferred, a transfer intermediate chamber connected to a rear side of the first vacuum transfer chamber, a second vacuum transfer chamber connected to a rear side of the transfer intermediate chamber to which the wafer from the transfer intermediate chamber is transferred, a plurality of vacuum processing chambers connected to a rear side of the first vacuum transfer chamber for processing the wafer transferred thereto from the first vacuum transfer chamber, and a plurality of vacuum processing chambers connected to a rear side of the second vacuum transfer chamber for processing the wafer transferred thereto from the second vacuum transfer chamber, wherein transfer of the wafer is controlled so as to use a single vacuum processing chamber out of the plurality of vacuum processing chambers connected to the first vacuum transfer chamber.

Further according to the vacuum processing method of a semiconductor processing substrate of the present invention, a transfer robot is disposed in the first vacuum transfer chamber and the second vacuum transfer chamber respectively, each transfer robot comprising a plurality of arms, and transfer of the wafer via the transfer robot is controlled so as to use a single vacuum processing chamber out of the plurality of vacuum processing chambers connected to the first vacuum transfer chamber.

The present invention enables to provide a vacuum processing system and a vacuum processing method of a semiconductor processing substrate, having a high productivity per footprint.

Further, the present invention enables to provide a vacuum processing system and a vacuum processing method of a semiconductor processing substrate capable of suppressing the amount of generated particles and preventing the occurrence of cross-contamination.

DETAILED DESCRIPTION OF THE PREFERRED EMBODIMENTS

Now, the preferred embodiments of a vacuum processing system and a vacuum processing method for processing a semiconductor substrate according to the present invention will be described in detail with reference to the drawings.

Figure 1:
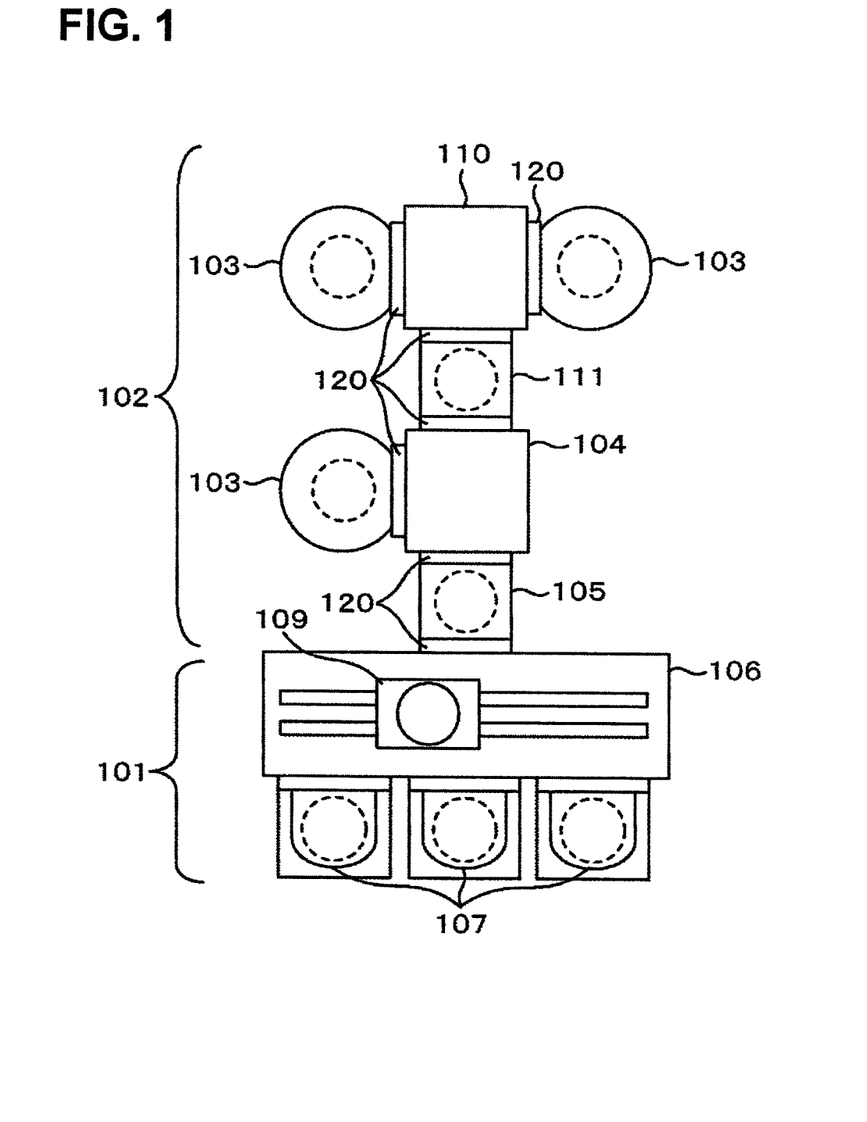
FIG. 1 is an explanatory view showing an outline of the overall arrangement of a vacuum processing system including a vacuum processing apparatus according to a first embodiment of the present invention.

FIG. 1 illustrates an outline of the overall arrangement of the vacuum processing system including a plurality of vacuum processing chambers according to a first embodiment of the present invention.

A vacuum processing system 100 including a plurality of vacuum processing chambers 103, 103 and 103 according to a first preferred embodiment of the present invention shown in FIG. 1 is mainly composed of an atmospheric block 101 and a vacuum block 102. The atmospheric block 101 is a section for transferring in atmospheric pressure and determining the storage positions of semiconductor wafers as objects to be processed, and the vacuum block 102 is a block for transferring wafers in a pressure decompressed from atmospheric pressure and for processing the wafers in the predetermined vacuum processing chamber 103. The system 100 also comprises a lock chamber 105 in which the pressure is increased and decreased between atmospheric pressure and vacuum pressure while having a wafer stored therein, which is disposed between the vacuum block 102 for transferring and processing wafers and the atmospheric block 101.

The first preferred embodiment of the vacuum processing system 100 according to the present invention relates to a system configuration having a high productivity per footprint, wherein the number of vacuum processing chambers 103 is three and the transfer time in the vacuum block 102 is longer compared to the transfer time in the atmospheric block 101. According further to the present embodiment, the time required for processing a wafer in the vacuum processing chambers 103 or the stay time of the wafer in the vacuum processing chamber 103 is shorter than the time required for transferring the wafer. Based on these conditions, the overall processing time is restricted by the transferring process, and this state is called a limited transfer rate.

The atmospheric block 101 has a substantially rectangular solid shaped housing 106 storing an atmospheric transfer robot 109 therein, and on the front side of the housing 106 are disposed a plurality of cassette stands 107, 107 and 107. Cassettes storing wafers as objects to be processed or wafers for cleaning the vacuum processing chamber 103 are placed on multiple cassette stands 107, 107 and 107.

A single lock chamber 105 is disposed adjacent to the atmospheric block 101 in the vacuum block 102. The lock chamber 105 is disposed between a first vacuum transfer chamber 104 of the vacuum block 102 and the atmospheric block 101, for varying the inner pressure thereof between atmospheric pressure and vacuum pressure while storing a wafer therein so as to transfer the wafer between the atmospheric side and the vacuum side. The lock chamber 105 has a stage for loading two or more wafers in a vertically stacked state. The first vacuum transfer chamber 104 has a substantially rectangular planar shape having the interior thereof decompressed, and has wafers transferred therein.

The first vacuum transfer chamber 104 can have vacuum processing chambers 103 for processing the wafers connected to two sides thereof. According to the first embodiment of the present invention, the vacuum processing chamber 103 is connected to only one of the two sides of the first vacuum transfer chamber 104. Further, though the first vacuum transfer chamber 104 has a substantially rectangular planar shape, the shape thereof can be triangular or other polygonal shapes, or can be spherical. Moreover, the other side of the first vacuum transfer chamber 104 comprises a vacuum transfer intermediate chamber 111 for transferring wafers between a second vacuum transfer chamber 110. The vacuum transfer intermediate chamber 111 also has a stage for loading two or more wafers in a vertically stacked state, similar to the lock chamber 105. Thus, it becomes possible to shorten the transfer time, which takes up much of the overall processing time.

Furthermore, a first vacuum transfer chamber 104 is connected to one side of the vacuum transfer intermediate chamber 111, and a second vacuum transfer chamber 110 is connected to the other side thereof. The second vacuum transfer chamber 110 also has a substantially rectangular planar shape, and can have three vacuum processing chambers 103 connected thereto, but according to the present embodiment, there are two vacuum processing chambers 103 and 103 connected thereto. Further, the second vacuum transfer chamber 110 has a substantially rectangular planar shape according to the present embodiment, but it can have other polygonal shapes.

Now, it is important that the number of vacuum processing chambers 103 connected to the first vacuum transfer chamber 104 disposed on the front side is smaller than the number of vacuum processing chambers 103 connected to the second vacuum transfer chamber 110 disposed on the rear side of the system. According to the present embodiment, the number of vacuum processing chambers 103 connected to the first vacuum transfer chamber 104 disposed on the front side is one, and the number of vacuum processing chambers 103 connected to the second vacuum transfer chamber 110 disposed on the rear side is two. According to the present invention, the vacuum processing chamber 103 connected to the first vacuum transfer chamber 104 disposed on the front side is called "a front side vacuum processing chamber", and the vacuum processing chambers 103 and 103 connected to the second vacuum transfer chambers 110 disposed on the rear side are called "rear side vacuum processing chambers".

The vacuum block 102 is a chamber capable of having the interior thereof decompressed and maintained to a high degree of vacuum.

Figure 2A:
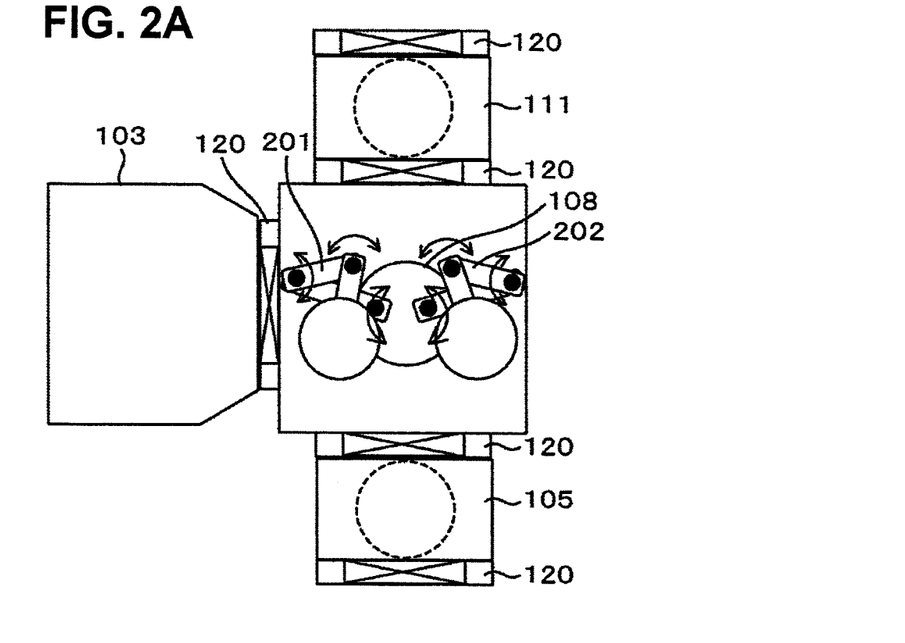
FIG. 2A is an enlarged view showing the vacuum transfer chamber according to the embodiment illustrated in FIG. 1, wherein the robot arm is retracted.
Figure 2B:
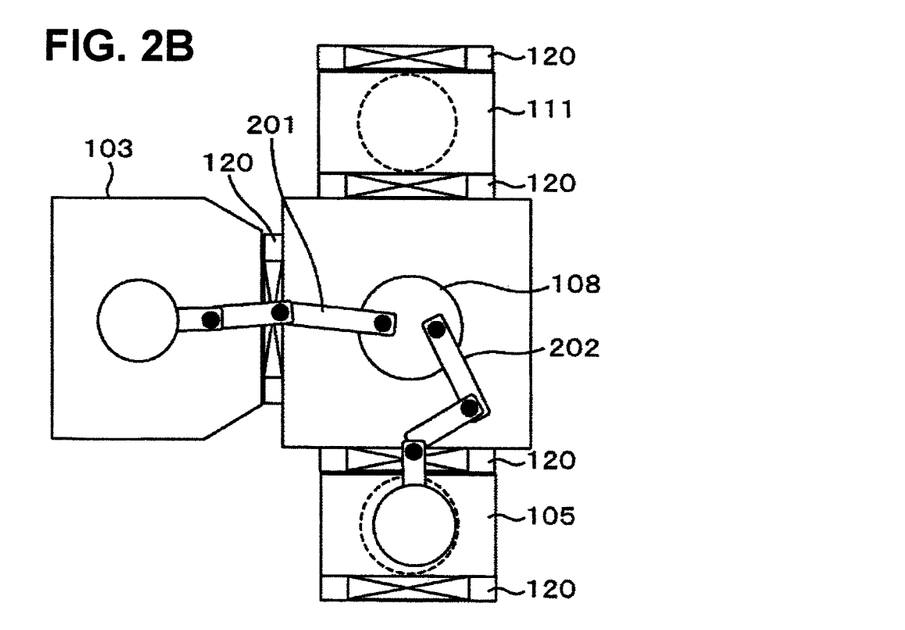
FIG. 2B is an enlarged view showing the vacuum transfer chamber according to the embodiment illustrated in FIG. 1, wherein the robot arm is extended.

The first vacuum transfer chamber 104 is a transfer chamber for transferring wafers in the interior thereof. The first vacuum transfer chamber 104 has disposed in a center area in the interior thereof a vacuum transfer robot 108 (FIG. 2) for transferring wafers in vacuum between the lock chamber 105 and the vacuum processing chamber 103 or between the lock chamber 105 and the vacuum transfer intermediate chamber 111. Similarly, the second vacuum transfer chamber 110 has disposed in a center area in the interior thereof a vacuum transfer robot 108 (FIG. 2) for transferring wafers in vacuum between the vacuum transfer intermediate chamber 111 and one of the two vacuum processing chambers 103 and 103. The vacuum transfer robots 108 disposed in the first vacuum transfer chamber 104 and the second vacuum transfer chamber 110 supports a wafer on its arm and transfers the wafer into or out of a wafer stage disposed in the vacuum processing chamber 103, the lock chamber 105 or the vacuum transfer intermediate chamber 111. Passages having a valve 120 that opens and closes in an airtight manner are disposed between the first vacuum transfer chamber 104 and the vacuum processing chamber 103, the lock chamber 105 and the vacuum transfer intermediate chamber 111, respectively. Similarly, passages having a valve 120 that opens and closes in an airtight manner are disposed between the second vacuum transfer chamber 110 and the vacuum processing chamber 103 and the vacuum transfer intermediate chamber 111, respectively. These passages are opened and closed via the valve 120.

Next, we will describe an outline of the wafer transfer process according to the vacuum processing method of a wafer for processing a wafer via the vacuum processing system 100 arranged as above.

A plurality of semiconductor wafers stored in a cassette placed on either one of the plurality of cassette stands 107, 107 and 107 are subjected to processing either via the decision of a control unit (not shown) for controlling the operation of the vacuum processing system 100 or via a command from a control unit (not shown) of a manufacturing line in which the vacuum processing system 100 is installed. First, the atmospheric transfer robot 109 having received a command from the control unit takes out a specific wafer from within a cassette, and transfers the wafer to the lock chamber 105.

The lock chamber 105 to which the wafer is transferred and stored has a valve 120 connected thereto closed in an airtight manner with the transferred wafer stored in the chamber, and the chamber is decompressed to a predetermined pressure. The lock chamber 105 can store two or more wafers. Thereafter, the valve 120 disposed on the side facing the first vacuum transfer chamber 104 is opened, by which the lock chamber 105 is communicated with the first vacuum transfer chamber 104, and the vacuum transfer robot 108 extends its arm to the interior of the lock chamber 105 and transfers the wafer in the lock chamber 105 toward the first vacuum transfer chamber 104. The first vacuum transfer chamber 104 can have two or more wafers stored therein. The vacuum transfer robot 108 transfers the wafer loaded on its arm to either the vacuum processing chamber 103 or the vacuum transfer intermediate chamber 111 determined in advance when the wafer is taken out of the cassette.

According to the present embodiment, one of the multiple valves 120 is selected to be opened and closed. In other words, when the wafer is transferred from the first vacuum transfer chamber 104 to the front-side vacuum processing chamber 103, the valve 120 opening and closing the passage between the vacuum transfer intermediate chamber 111 and the first vacuum transfer chamber 104 and the valve 120 opening and closing the passage between the lock chamber 105 and the first vacuum transfer chamber 104 are closed, while the valve 120 opening and closing the passage between the front-side vacuum processing chamber 103 and the first vacuum transfer chamber 104 is opened, by which the wafer is transferred into the vacuum processing chamber 103. Moreover, when the wafer carried into the vacuum transfer intermediate chamber 111 is transferred toward the rear-side vacuum processing chamber 103, the valve 120 opening and closing the passage between the vacuum transfer intermediate chamber 111 and the first vacuum transfer chamber 104 is closed, by which the vacuum transfer intermediate chamber 111 is airtightly sealed. Thereafter, the valve 120 opening and closing the passage between the vacuum transfer intermediate chamber 111 and the second vacuum transfer chamber 110 is opened and the vacuum transfer robot 108 disposed in the second vacuum transfer chamber 110 is extended, so as to transfer the wafer into the second vacuum transfer chamber 110. Next, the vacuum transfer robot 108 transfers the wafer loaded on its arm to either one of the predetermined two vacuum processing chambers 103 and 103 disposed on the rear side thereof.

After the wafer is transferred to any one of the vacuum processing chambers 103 and 103 disposed on the rear side, the valve for opening and closing the passage between that vacuum processing chamber 103 and the second vacuum transfer chamber 110 is closed and the vacuum processing chamber 103 is airtightly sealed. Thereafter, processing gas is introduced into the vacuum processing chamber 103, and when the pressure within the vacuum processing chamber 103 reaches a predetermined pressure, the wafer is processed. The wafer processing performed in this vacuum processing chamber 103 is the same as the process performed in the vacuum processing chamber 103 disposed on the front side.

In any of the vacuum processing chambers 103, when the termination of wafer processing is detected, the valve 120 opening and closing the passage between that vacuum processing chamber 103 and the first vacuum transfer chamber 104 or the second vacuum transfer chamber 110 connected thereto is opened, and the vacuum transfer robot 108 within that transfer chamber sends the processed wafer to the lock chamber 105 or the vacuum transfer intermediate chamber 111 via an opposite route as when the wafer was transferred into the vacuum processing chamber 103. When the wafer is transferred from the rear side vacuum processing chamber 103 via the vacuum transfer intermediate chamber 111 to the lock chamber 105, or when the wafer is transferred from the front-side vacuum processing chamber 103 to the lock chamber 105, the valve 120 opening and closing the passage between the lock chamber 105 and the first vacuum transfer chamber 104 is closed, the transfer chamber of the first vacuum transfer chamber 104 is airtightly sealed, and the pressure within the lock chamber 105 is raised to atmospheric pressure.

Thereafter, the valve 120 on the inner side of the housing 106 is opened to communicate the inner side of the lock chamber 105 and the inner side of the housing 106 in atmospheric pressure, and the atmospheric transfer robot 109 transfers the wafer from the lock chamber 105 to the original cassette and the cassette is returned to its original position of the cassette stand.

The present invention exerts its effect especially in the case of a limited transfer rate in which the time required for processing the wafer in the vacuum processing chamber 103 or the stay time of the wafer in the vacuum processing chamber 103 is shorter than the wafer transfer time. The vacuum processing system according to the first preferred embodiment of the present invention comprises a first vacuum transfer chamber 104 disposed on the front side and the second vacuum transfer chamber 110 disposed on the rear side, wherein the first vacuum transfer chamber 104 disposed on the front side has a single vacuum processing chamber 103 and the second vacuum transfer chamber 110 disposed on the rear side has two vacuum processing chambers 103 and 103. In this case, each of the first vacuum transfer chamber 104 and the second vacuum transfer chamber 110 has disposed therein a vacuum transfer robot with two arms. As described, by arranging a single vacuum processing chamber 103 on the front side and two vacuum processing chambers 103 and 103 on the rear side, the transfer wait time of the processed wafer within the front-side vacuum processing chamber 103 is shortened, and a vacuum processing system having superior productivity is realized.

FIGS. 2A and 2B are enlarged views of the first vacuum transfer chamber 104 illustrated in FIG. 1. The vacuum transfer robot 108 has a first arm 201 and a second arm 202 for transferring the wafers. The robot has two arms according to the present embodiment, but the number of arms can be three or four.

Each arm 201 and 202 has a structure in which multiple beam members have both ends thereof connected via joints. Each arm 201 and 202 is designed so that multiple beam members are axially supported in pivotable manner at both ends thereof, so that each arm 201 and 202 is capable of pivoting and expanding or shrinking in both the vertical and horizontal directions independently around the axes on the base ends of the arms, respectively. According to this arrangement, it becomes possible to independently control the carrying in and carrying out of multiple wafers, and to enhance the transfer performance by accessing multiple transfer destinations in parallel or carrying in and carrying out two wafers simultaneously.

FIG. 2A shows a state in which wafers are transferred into the first vacuum transfer chamber 104 from separate locations via arms 201 and 202. FIG. 2B shows a state in which the first arm 201 transfers a wafer to the vacuum processing chamber 103 and the second arm 202 transfers a wafer to the lock chamber 105 in parallel. In this case, unlike the case where wafers are transferred one at a time and valves 120 are selectively opened one at a time, two valves 120 and 120 required for accessing the necessary chambers must be opened and closed simultaneously.

Even in such case, by adopting the vacuum processing system 100 having one vacuum processing chamber 103 disposed on the front side and two vacuum processing chambers 103 and 103 disposed on the rear side, the wafer processing efficiency per footprint can be enhanced.

This is due to the following reasons. In the case of the limited transfer rate mentioned earlier, when the time required for transferring the wafer into the vacuum processing chamber 103 (the time from the state where the vacuum transfer robot 108 holding the wafer is at standby state in front of the vacuum processing chamber 103 to when the transfer of the wafer into the vacuum processing chamber 103 is completed and the valve 120 is closed) is compared with the time required for transferring the wafer into the vacuum transfer intermediate chamber 111 (the time from the state where the vacuum transfer robot 108 holding the wafer is at standby state in front of the transfer intermediate chamber 111 to when the transfer of the wafer into the transfer intermediate chamber 111 is completed and the valve 120 is closed), the transfer time for transferring the wafer into the vacuum transfer intermediate chamber 111 is shorter. Therefore, when assuming that two vacuum processing chambers 103 are connected to the front-side first vacuum transfer chamber 104 and only one vacuum processing chamber 103 is connected to the rear-side second vacuum transfer chamber 110, the wafer transfer time within the first vacuum transfer chamber 104 arranged on the front side becomes the bottleneck of the overall transfer time of the vacuum processing system 100. On the other hand, according to the first embodiment of the present invention, the second vacuum transfer chamber 110 disposed on the rear side becomes the bottleneck so as to prevent the first vacuum transfer chamber 104 disposed on the front side from becoming the bottleneck, according to which the overall processing efficiency of the whole vacuum processing system 100 is prevented from being deteriorated. Therefore, the arrangement according to the present embodiment enables to improve the wafer processing efficiency per footprint.

According to the first preferred embodiment of the present invention, the first vacuum transfer chamber 104 and the front-side vacuum processing chamber 103 or the lock chamber 105 (or the second vacuum transfer chamber 110 and the rear-side vacuum processing chambers 103 or the vacuum transfer intermediate chamber 111) are communicated via valves 120 that open and close in an exclusive manner, so that it becomes possible to suppress the generation of particles and cross-contamination effectively.

According to the system configuration shown in FIG. 1, the maximum number of physically connectable vacuum processing chambers 103 is five. However, according to the present invention, it is important that the number of vacuum processing chambers 103 connected to the first vacuum transfer chamber 104 arranged on the front side is smaller than the number of vacuum processing chambers 103 connected to the second vacuum transfer chamber 110 arranged on the rear side. Therefore, the following embodiment illustrates an operation example where the processing efficiency of wafers equivalent to the first embodiment shown in FIG. 1 is obtained in a case where four vacuum processing chambers are connected.

Figure 3:
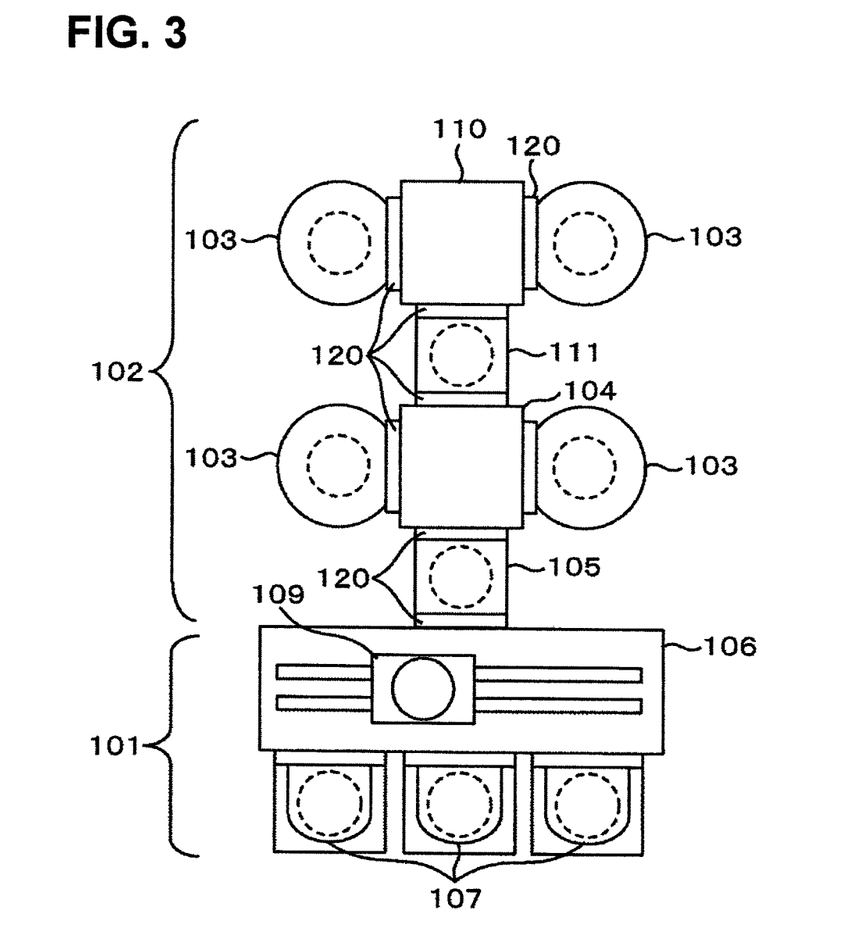
FIG. 3 is an explanatory view showing an outline of the overall arrangement of the whole vacuum processing system including the vacuum processing apparatus according to another embodiment of the present invention.

FIG. 3 illustrates an example in which one vacuum processing chamber 103 is additionally connected to the first vacuum transfer chamber 104 arranged on the front side of the first embodiment, according to which two vacuum processing chambers 103 and 103 are connected thereto. According to the second preferred embodiment, either one of the two vacuum processing chambers 103 and 103 connected to the first vacuum transfer chamber 104 is selectively used in response to the processing time for processing wafers. Then, the multiple vacuum processing chambers 103 and 103 connected to the second vacuum transfer chamber disposed on the rear side farthest from the atmospheric transfer side is used for production, to thereby achieve the same improved production efficiency as that of embodiment 1 illustrated in FIG. 1.

However, if the wafer transfer time in the first vacuum transfer chamber 104 disposed on the front side does not become a bottleneck of the overall transfer time of the vacuum processing system 100, which is not the object of the present invention, by having a plurality of vacuum processing chambers 103 and 103 connected to the first vacuum transfer chamber 104 arranged on the front side, the processing efficiency may be enhanced by using all the vacuum processing chambers 103 and 103 disposed on the front side, depending on the wafer processing time in the vacuum processing chamber 103 or the stay time of the wafer in the vacuum processing chamber 103. Therefore, the control unit (not shown) disposed in the vacuum processing apparatus does not exclude an operation for optimizing the production efficiency of the vacuum processing chambers 103 in response to the processing time.

Even according to the second embodiment, only one of the multiple valves 120 are selectively opened and closed. In other words, the valve 120 opening and closing the passage between the vacuum transfer intermediate chamber 111 and the first vacuum transfer chamber 104, the valve 120 opening and closing the passage between the lock chamber 105 and the first vacuum transfer chamber 104 and the valve 120 opening and closing the passage between the front right side vacuum processing chamber 103 and the first vacuum transfer chamber 104 are closed, and the valve 120 for opening and closing the passage between the front left side vacuum processing chamber 103 and the first vacuum transfer chamber 104 is opened, so as to transfer a wafer to the front left side vacuum processing chamber 103. Either one of the left and right vacuum processing chambers 103 can be used arbitrarily. Further, after the wafer is transferred to the vacuum transfer intermediate chamber 111, the valve 120 opening and closing the passage between the first vacuum transfer chamber 104 is closed, by which the vacuum transfer intermediate chamber 111 is airtightly sealed. Thereafter, the valve 120 for opening and closing the passage between the vacuum transfer intermediate chamber 111 and the second vacuum transfer chamber 110 is opened, the vacuum transfer robot 108 disposed in the second vacuum transfer chamber 110 is extended, and the wafer is transferred into the second vacuum transfer chamber 110. The vacuum transfer robot 108 transfers the wafer loaded on its arm to either one of the rear side vacuum processing chambers 103 determined in advance when the wafer is taken out of the cassette.

After the wafer is transferred to any one of the rear side vacuum processing chambers 103, the valve 120 opening and closing the passage between the vacuum processing chamber 103 and the first vacuum transfer chamber 104 is closed and the vacuum processing chamber 103 is airtightly sealed. Thereafter, processing gas is introduced into the vacuum processing chamber 103 and when the pressure within the vacuum processing chamber 103 reaches a predetermined pressure, the wafer is processed.

When it is detected that the processing of the wafer is completed, the valve opening and closing the passage between the first vacuum transfer chamber 104 or the second transfer chamber 110 connected to the above-mentioned vacuum processing chamber 103 is opened, and the vacuum transfer robot 108 transfer the processed wafer toward the lock chamber 105 via the opposite route as when the wafer was carried into the vacuum processing chamber 103. When the wafer is carried into the lock chamber 105, the valve 120 opening and closing the passage between the lock chamber 105 and the first vacuum transfer chamber 104 is closed, the transfer chamber of the first vacuum transfer chamber 104 is airtightly sealed, and the pressure within the lock chamber 105 is raised to atmospheric pressure.

Thereafter, the valve 120 on the inner side of the housing 106 is opened to communicate the interior of the lock chamber 105 with the interior of the housing 106, and the atmospheric transfer robot 109 transferes the wafer from the lock chamber 105 to the original cassette and returns the wafer to the original position within the cassette.

The present invention provides a vacuum processing method capable of exerting a similar effect as the first embodiment by connecting two vacuum processing chambers 103 and 103 to the first vacuum transfer chamber 104 arranged on the front side as illustrated in the second embodiment, by arbitrarily selecting and using only one of the vacuum processing chambers 103 and 103 arranged on the front side.

What is claimed is:

1. A vacuum processing apparatus which processes a semiconductor wafer, comprising:
   an atmospheric transfer chamber having a plurality of cassette stands arranged on a front side thereof for transferring the wafer inside thereof, the wafer being stored in a cassette disposed on one of the plurality of cassette stands;
   a lock chamber arranged on a rear side of the atmospheric transfer chamber, for storing in an interior thereof the wafer transferred from the atmospheric transfer chamber;
   a first vacuum transfer chamber connected to a rear side of the lock chamber, an inside of the first vacuum transfer chamber configured to be evacuated and through which the wafer from the lock chamber is transferred;
   a transfer intermediate chamber connected to a rear side of the first vacuum transfer chamber;
   a second vacuum transfer chamber connected to a rear side of the transfer intermediate chamber, an inside of the second vacuum transfer chamber configured to be evacuated and through which the wafer from the transfer intermediate chamber is transferred;
   at least one vacuum processing chamber coupled to a lateral side of the first vacuum transfer chamber for processing the wafer transferred thereto from the first vacuum transfer chamber, the wafer being processed in the vacuum processing chamber using gas supplied thereto;

two or more vacuum processing chambers coupled to a lateral side or a rear side of the second vacuum transfer chamber for processing the wafer transferred thereto from the second vacuum transfer chamber, the wafer being processed in the vacuum processing chamber using gas supplied thereto;

a plurality of first gate valves for the first vacuum transfer chamber which are respectively disposed between the first vacuum transfer chamber and each of the lock chamber, the transfer intermediate chamber, and the vacuum processing chamber coupled to the first vacuum transfer chamber, the plurality of first gate valves opening and closing to open or close communications therebetween;

a plurality of second gate valves for the second vacuum transfer chamber which are respectively disposed between the second vacuum transfer chamber and each of the transfer intermediate chamber and the vacuum processing chamber coupled to the second transfer chamber, and the plurality of second gate valves opening and closing to open or close communications therebetween; and a first transfer robot and a second transfer robot disposed in the first vacuum transfer chamber and the second vacuum transfer chamber, respectively, each transfer robot including a plurality of arms for transferring wafers;

wherein the vacuum processing apparatus transfers the wafer transferred from the atmospheric transfer chamber to the lock chamber to one of the vacuum processing chambers via a first path including the first vacuum transfer chamber or a second path including the first vacuum transfer chamber and the second vacuum transfer chamber, and returns the processed wafer from one of the vacuum processing chambers to the lock chamber via the same path;

wherein the lock chamber, the plurality of vacuum processing chambers, the first vacuum, transfer chamber, the transfer intermediate chamber and the second vacuum transfer chamber constitutes a vacuum block of the vacuum processing apparatus, and a plurality of chambers in the vacuum block are capable of being coupled to configure one vacuumed vessel inside of which is evacuated, and the vacuum processing apparatus further comprising a control unit which controls an operation of one of the first gate valves for the first vacuum transfer chamber and the second gate valves for the second vacuum transfer chamber so as to open and close while the other first and second gate valves are maintained in a closed position, and wherein the control unit which, in a state where communication between the first vacuum transfer chamber and the second vacuum transfer chamber is closed:

controls an operation of one of the first gate valves for the first vacuum transfer chamber including the gate valve disposed on the first vacuum transfer chamber side of the transfer intermediate chamber, so as to open the communication between the first vacuum transfer chamber and the vacuum processing chamber while the other first gate valves for the first vacuum transfer chamber are maintained in a closed position, and to close the communication after the wafer is transferred via the first transfer robot, controls an operation of one of the second gate valves for the second vacuum transfer chamber including the gate valve disposed on the second vacuum transfer chamber side of the transfer intermediate chamber, so as to open the communication between the second vacuum transfer chamber and the vacuum processing chamber while the other second gate valves for the second vacuum transfer chamber are maintained in a closed position, and to close the communication after the wafer is transferred via the second transfer robot, and controls the transfers of the wafers in both the first and the second vacuum transfer chambers in parallel.

2. The vacuum processing apparatus according to claim 1, comprising a first vacuum processing chamber connected to the first vacuum transfer chamber for processing the wafer transferred thereto from the first vacuum transfer chamber, and second and third vacuum processing chambers connected to the second vacuum transfer chamber for processing the wafer transferred thereto from the second vacuum transfer chamber, wherein the number of vacuum processing chambers connected to the first vacuum transfer chamber is one, and the number of vacuum processing chambers connected to the second vacuum transfer chamber is two.

3. An operating method of a vacuum processing apparatus which processes a semiconductor wafer, wherein the vacuum processing apparatus comprising:

an atmospheric transfer chamber having a plurality of cassette stands arranged on a front side thereof for transferring the wafer inside thereof, the wafer being stored in a cassette disposed on one of the plurality of cassette stands;

a lock chamber arranged on a rear side of the atmospheric transfer chamber for storing in an interior thereof the wafer transferred from the atmospheric transfer chamber;

a first vacuum transfer chamber connected to a rear side of the lock chamber, an inside of the first vacuum transfer chamber configured to be evacuated and to which the wafer from the lock chamber is transferred;

a transfer intermediate chamber connected to a rear side of the first vacuum transfer chamber;

a second vacuum transfer chamber connected to a rear side of the transfer intermediate chamber, an inside of the second vacuum transfer chamber configured to be evacuated and to which the wafer from the transfer intermediate chamber is transferred;

at least one vacuum processing chambers coupled to a lateral side of the first vacuum transfer chamber for processing the wafer transferred thereto from the first vacuum transfer chamber, the wafer being processing in the vacuum processing chamber using gas supplied thereto;

two or more vacuum processing chambers coupled to a lateral side or a rear side of the second vacuum transfer chamber for processing the wafer transferred thereto from the second vacuum transfer chamber, the wafer being processed in the vacuum processing chamber using gas supplied thereto;

a plurality of first gate valves for the first vacuum transfer chamber which respectively are disposed between the first vacuum transfer chamber and each of the lock chamber, the transfer intermediate chamber, and the vacuum processing chamber coupled to the first vacuum transfer chamber, the plurality of first gate valves opening and closing communications therebetween;

a plurality of second gate valves for the second vacuum transfer chamber which are respectively disposed between the second vacuum transfer chamber and each of the transfer intermediate chamber and the vacuum processing chamber coupled to the second transfer chamber, and the plurality of second gate valves opening and closing communications therebetween;

a first transfer robot and a second transfer robot disposed in the first vacuum transfer chamber and the second vacuum transfer chamber, respectively, each transfer robot including a plurality of arms for transferring wafers;

the vacuum processing apparatus transfers the wafer, transferred from the atmospheric transfer chamber to the lock chamber, to one of the vacuum processing chambers via a first path including the first vacuum transfer chamber or via a second path including the first vacuum transfer chamber and the second vacuum transfer chamber, and returns the processed wafer from one of the vacuum processing chambers to the lock chamber via the same path, and the lock chamber, the plurality of vacuum processing chambers, the first vacuum transfer chamber, the transfer intermediate chamber and the second vacuum transfer chamber constitutes a vacuum block of the vacuum processing apparatus, and a plurality of chambers in the vacuum block are capable of being coupled to configure one vacuumed vessel inside of which is evacuated;

the operation method of the vacuum processing apparatus comprising:

controlling an operation of one of the first gate valves for the first vacuum transfer chamber and the second gate valves for the second vacuum transfer chamber so as to open and close while the other first and second gate valves are maintained in a closed position, and in a state where communication between the first vacuum transfer chamber and the second vacuum transfer chamber is closed, controlling the operation of one of the first gate valves for the first vacuum transfer chamber including the gate valve disposed on the first vacuum transfer chamber side of the transfer intermediate chamber, so as to open the communication between the first vacuum transfer chamber and the vacuum processing chamber while the other first gate valves for the first vacuum transfer chamber are maintained in a closed position, and to close the communication after the wafer is transferred via the first transfer robot, controlling the operation of one of the second gate valves for the second vacuum transfer chamber including the gate valve disposed on the second vacuum transfer chamber side of the transfer intermediate chamber, so as to open the communication between the second vacuum transfer chamber and the vacuum processing chamber while the other second gate valves for the second vacuum transfer chamber are maintained in a closed position, and to close the communication after the wafer is transferred via the second transfer robot, and controlling the transfers of the wafers in both the first and the second vacuum transfer chamber in parallel.

4. The vacuum processing apparatus according to claim 1, wherein the control unit controls the opening and closing thereafter of the gate valves for the first vacuum transfer chamber between the first vacuum transfer chamber and the vacuum processing chamber coupled thereto, and the opening and closing thereafter of the second gate valves for the second vacuum transfer chamber between the second vacuum transfer chamber and the vacuum processing chamber coupled thereto, while the communication between the first and second vacuum transfer chambers is maintained to be closed.

5. The vacuum processing apparatus according to claim 4, wherein the control unit controls the operations of the each of the gate valves for the first vacuum transfer chamber and the operations of the each of the second gate valves for the second vacuum transfer chamber so as to open and thereafter close exclusively in the each of the first and second vacuum transfer chambers.

6. The operating method of the vacuum processing chamber according to claim 3, wherein the opening and closing thereafter of the gate valves for the first vacuum transfer chamber between the first vacuum transfer chamber and the vacuum processing chamber coupled thereto, and the opening and closing thereafter of the second gate valves for the second vacuum transfer chamber between the second vacuum transfer chamber and the vacuum processing chamber coupled thereto, are carried out while the communication between the first and second vacuum transfer chambers is maintained in a closed position.

7. The operating method for the vacuum processing chamber according to claim 3, wherein the opening and closing thereafter of the each of the gate valves for the first vacuum transfer chamber and the opening and closing thereafter of the each of the second gate valves for the second vacuum transfer chamber, are carried out exclusively in the each of the first and second vacuum transfer chambers.

* * * * *